(12) United States Patent
Wang et al.

(10) Patent No.: US 11,474,260 B1
(45) Date of Patent: Oct. 18, 2022

(54) APPARATUS AND METHOD OF GENERATING WEIL CODES

(71) Applicant: Beken Corporation, Shanghai (CN)

(72) Inventors: Weifeng Wang, Shanghai (CN); Jiazhou Liu, Shanghai (CN); Pengfei Zhang, Shanghai (CN); Dawei Guo, Shanghai (CN)

(73) Assignee: Beken Corporation, Shanghai (CN)

( * ) Notice: Subject to any disclaimer, the term of this patent is extended or adjusted under 35 U.S.C. 154(b) by 0 days.

(21) Appl. No.: 17/304,098

(22) Filed: Jun. 14, 2021

(30) Foreign Application Priority Data

May 26, 2021 (CN) .......................... 202110579541.4

(51) Int. Cl.
| | |
|---|---|
| *G01S 19/30* | (2010.01) |
| *G01S 19/37* | (2010.01) |
| *G01S 19/29* | (2010.01) |
| *H03K 19/21* | (2006.01) |

(52) U.S. Cl.
CPC .............. *G01S 19/30* (2013.01); *G01S 19/29* (2013.01); *G01S 19/37* (2013.01); *H03K 19/21* (2013.01)

(58) Field of Classification Search
CPC ...................................................... G01S 19/30

USPC ......................................................... 375/150
See application file for complete search history.

(56) References Cited

U.S. PATENT DOCUMENTS

| | | | | |
|---|---|---|---|---|
| 5,309,349 A | * | 5/1994 | Kwan ................ | G01R 19/0092 363/78 |
| 7,852,964 B2 | * | 12/2010 | Rajappan ............. | H04B 7/0413 375/147 |
| 2020/0052806 A1 | * | 2/2020 | Cao ..................... | H04J 13/0022 |

* cited by examiner

*Primary Examiner* — Lihong Yu
(74) *Attorney, Agent, or Firm* — Schwegman Lundberg & Woessner, P.A.

(57) ABSTRACT

A Weil code generator and a method of generating Weil codes with a Weil code length (N) are provided. The Weil code generator includes a plurality of parallel channels (10), a multi-channel read arbiter (20), and two parallel Legendre ROMs (30), which are connected in series. A channel of the plurality of channels stores a current Weil code to demodulate signals from a satellite. The multi-channel read arbiter (20) may determine a win channel from the plurality of channels. The two Legendre ROMs (30) respectively store a first and a second Legendre sequences (LS1, LS2) each having a Legendre sequence length (2N) being double the Weil code length (N). The Weil code generator may generate Weil codes efficiently.

17 Claims, 4 Drawing Sheets address-read control unit address-read control unit

APPARATUS AND METHOD OF GENERATING WEIL CODES

CROSS REFERENCE TO RELATED APPLICATIONS

This application claims priority to and incorporates by reference Chinese Patent Application No. 202110579541.4 filed May 26, 2021.

TECHNICAL FIELD

The present application relates to an apparatus and a method of generating codes, and more particularly a generator and a method of generating Weil codes.

BACKGROUND

In a Global Navigation Satellite System (GNSS), such as a Beidou III, Weil code generators are typically used to generate local Weil codes to demodulate satellite signals received by signal receivers. However, a typical Weil code generator may be costly complex in hardware and software design, may require large throughputs, and may cause high power consumption. Thus, an improved Weil code generator that can generate Weil codes efficiently is required.

BRIEF DESCRIPTION

According to an embodiment, a Weil code generator to generate Weil codes with a Weil code length (N) comprising: a plurality of channels in parallel, a channel of the plurality of channels storing a current Weil code to demodulate signals from a satellite, and comprising an address-read control unit, and a processing and registration unit; a multi-channel read arbiter connected in parallel to the plurality of channels to determine a win channel from the plurality of channels; and two Legendre ROMs connected in parallel to the read arbiter and respectively storing a first and a second Legendre sequences each having a Legendre sequence length (2N) being double the Weil code length (N).

According to an embodiment, a method of generating Wei codes using a Weil code generator, the Weil code generator comprising a plurality of parallel channels, a multi-channel read arbiter, and two parallel ROMs, connected in series, the method comprising: detecting an effective Weil code depth of a current Weil code stored in a channel of the plurality of channels, the channel communicating with a satellite; comparing the effective Weil code depth with a Legendre bit-read length of a first and a second Legendre sequences respectively stored in the two Legendre ROMs; responsive to the effective Weil code depth being detected less than the Legendre bit-read length, transmitting by the channel a request and a pair of sequence addresses to the read arbiter, each of the first and the second Legendre sequences having a Legendre sequence length (2N) being double the Weil code length (N); transmitting the pair of sequence addresses by the read arbiter respectively to the first and the second Legendre sequences; receiving by the channel, via the read arbiter, a first and a second S-bit data obtained respectively from the first and the second Legendre sequences as a function of the pair of sequence addresses; XORing the first and the second S-bit data by the channel to obtain an additional Weil code; and adding the additional Weil code to an end of the current Weil code to obtain an extended Weil code.

According to an embodiment, a system may comprise: a memory that stores instructions; and one or more processors configured by the instructions to perform operations comprising: detecting an effective Weil code depth of a current Weil code stored in a channel of the plurality of channels, the channel communicating with a satellite; comparing the effective Weil code depth with a Legendre bit-read length of a first and a second Legendre sequences respectively stored in the two Legendre ROMs; responsive to the effective Weil code depth being detected less than the Legendre bit-read length, transmitting by the channel a request and a pair of sequence addresses to the read arbiter, each of the first and the second Legendre sequences having a Legendre sequence length (2N) being double the Weil code length (N); transmitting the pair of sequence addresses by the read arbiter respectively to the first and the second Legendre sequences; receiving by the channel, via the read arbiter, a first and a second S-bit data obtained respectively from the first and the second Legendre sequences as a function of the pair of sequence addresses; XORing the first and the second S-bit data by the channel to obtain an additional Weil code; and adding the additional Weil code to an end of the current Weil code to obtain an extended Weil code.

BRIEF DESCRIPTION OF THE DRAWINGS

Non-limiting and non-exhaustive embodiments of the present application are described with reference to the following figures, wherein like reference numerals refer to like parts throughout the various views unless otherwise specified.

DETAILED DESCRIPTION OF THE ILLUSTRATED EMBODIMENTS

Various aspects and examples of the application will now be described. The following description provides specific details for a thorough understanding and enabling description of these examples. Those skilled in the art will understand, however, that the application may be practiced without many of these details.

Additionally, some well-known structures or functions may not be shown or described in detail, so as concise purpose and to avoid unnecessarily obscuring the relevant description.

The terminology used in the description presented below is intended to be interpreted in its broadest reasonable manner, even though it is being used in conjunction with a detailed description of certain specific examples of the application. Certain terms may even be emphasized below, however, any terminology intended to be interpreted in any restricted manner will be overtly and specifically defined as such in this Detailed Description section.

Without loss of generality, reference will be made to illustrative embodiments by taking a generator and a method of generating Weil codes as example. Those of ordinary skills in the art understand that this is only to describe the application clearly and adequately, rather than limit the scope of the application, which is defined by the appended claims.

Figure 1:
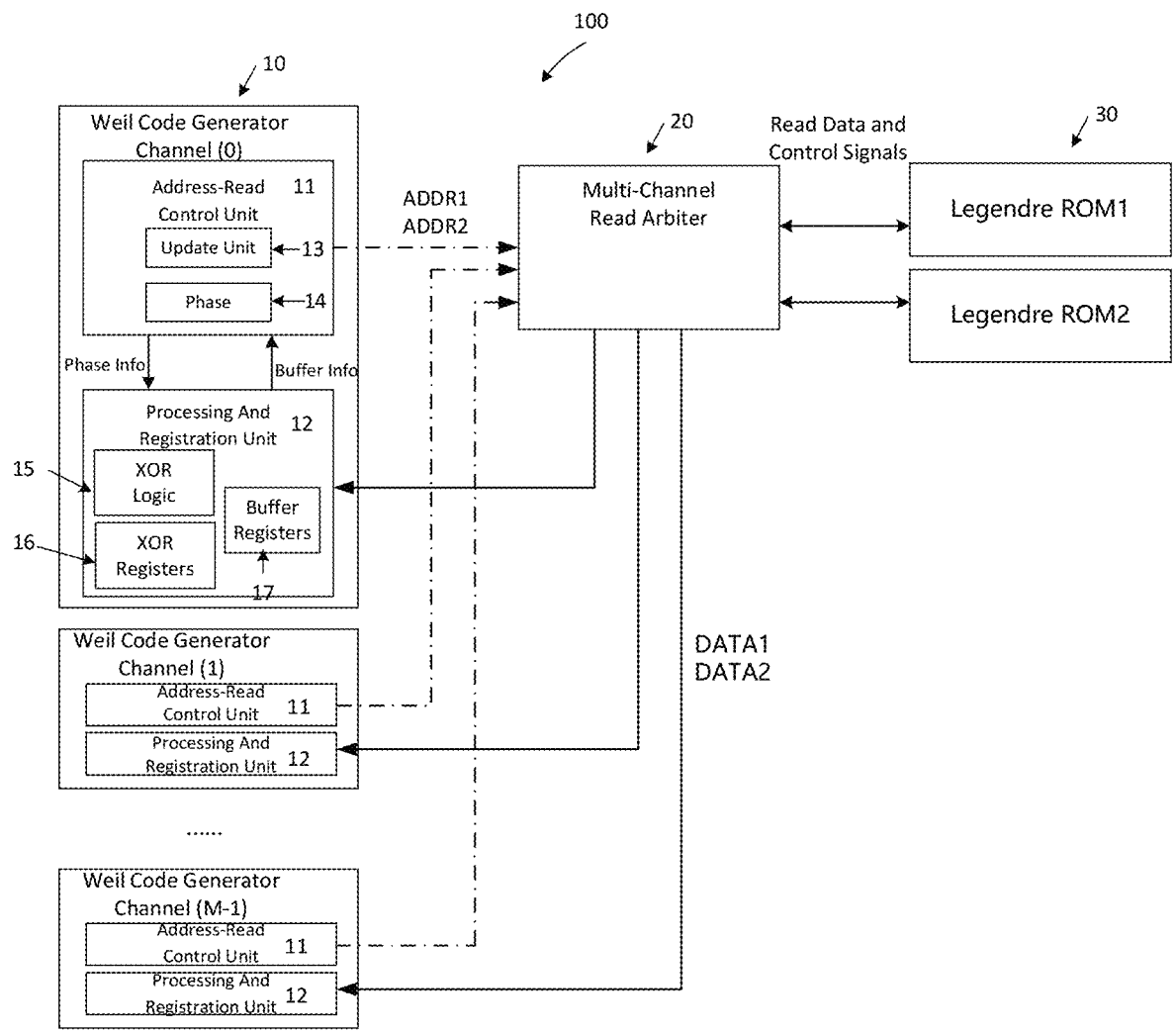
FIG. 1 is a diagram illustrating a Weil code generator to generate Weil codes with a Weil code length N according to an embodiment.

FIG. 1 is a diagram illustrating a Weil code generator (100) to generate Weil codes with a Weil code length N according to an embodiment.

According to an embodiment, the Weil code generator (100) may include M parallel channels (10(0), 10(1), 10(2), 10(3) . . . 10(M−1)), a multi-channel read arbiter (20), and two Legendre ROMs (30), which are connected in series. The number M (e.g., 20) of the channels (10) may depend on the number of satellites (not shown) that are intended to communicate the Weil code generator (100).

A channel (10) of the M channels may store a current Weil code to demodulate signals received from a satellite. The channel (10) may include an address-read control unit (11), and a processing and registration unit (12). The address-read control unit (11) may include an updating unit (13) and a phase data storage (14). The processing and registration unit (12) may include an XOR logic (15) (or an XOR operation unit), an XOR storage (16) (or XOR registers), and a buffer register (17) (or buffer registers) that may store the current Weil code.

The multi-channel read arbiter (20) is connected to the M parallel channels, and can be used to determine a win channel (such as 10(2)) from the M channels (10). In an embodiment, the read arbiter (20) may determine the win channel from the M channels (10) using a polling arbitration working in a sequential order to ensure the M channels to have equal arbitration chances to get access to the two ROMs (ROM1, ROM2).

Figure 2:
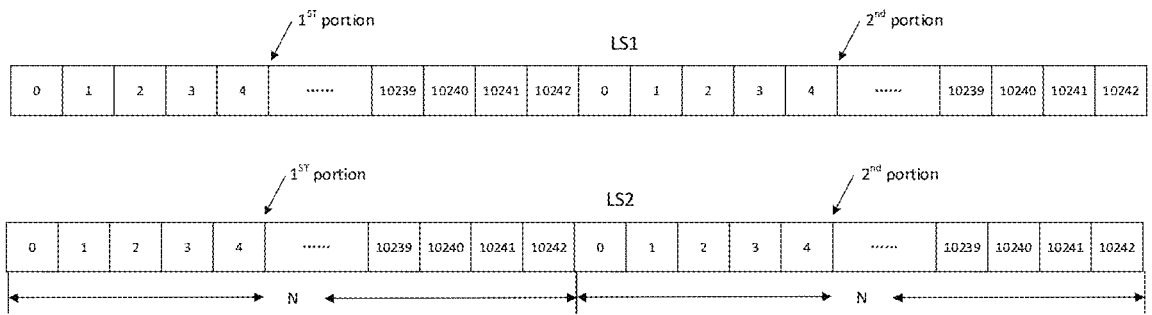
FIG. 2 is a diagram illustrating a first and a second Legendre sequences respectively stored in two ROMs according to an embodiment.

The two ROMs (30) respectively store a first and a second Legendre sequences (LS1, LS2) as shown in FIG. 2. The first and the second Legendre sequences (LS1, LS2) are the same Legendre sequences (LS) each having a Legendre sequence length 2N that is double the Weil code length N. N can be 10243 bits for example.

FIG. 2 is a diagram illustrating a first and a second Legendre sequences (LS1, LS2) respectively stored in two Legendre ROMs (ROM1, ROM2) according to an embodiment. The first Legendre sequence (LS1) has a first portion and a second portion in sequence, and the first portion and the second portion of the first Legendre sequence (LS1) are the same in data structure and each has a length N half of the Legendre sequence length 2N. Similarly, the second Legendre sequence (LS2) has a first portion and a second portion in sequence, and the first portion and the second portion of the second Legendre sequence (LS2) are the same in data structure and each has the length N half of the Legendre sequence length 2N.

Figure 3:
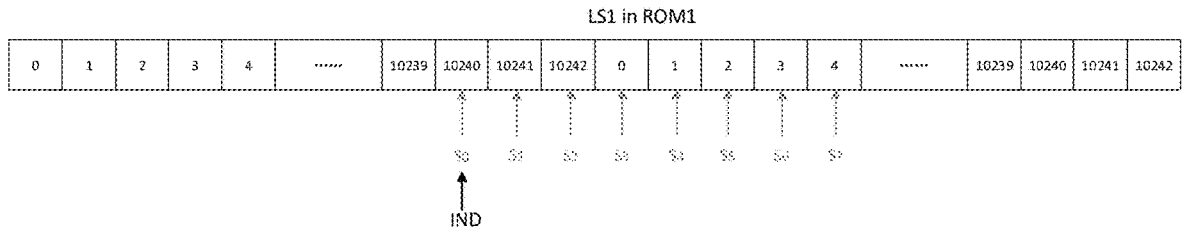
FIG. 3 is a diagram illustrating an example of reading S-bit data from the first Legendre sequence stored in the first ROM according to an embodiment.

FIG. 3 is a diagram illustrating an example of reading S-bit data from the first Legendre sequence (LS1) stored in the first ROM (ROM1) according to an embodiment. Responsive to receiving an address index (IND) as an input, the first Legendre sequence (LS1) can provide a S-bit data (including S number of bits, such as S0, S1, S2, S3, S4, S5, S6, S7) as an output. Here, S=8, for example. Alternatively, S may be 16, 32, 64, or 128. If the received index (IND) is located within the first portion (having the length N) of the first Legendre sequence (LS1), the first Legendre sequence (LS1) will directly read S-bit data (e.g., 8 bit data, S0-S7) without a need of a wrap-around operation. A wrap-around operation may be time-consuming and may affect the throughput of the Weil code generator (10).

Reading S-bit data from the second Legendre sequence (LS2) stored in the second ROM (ROM2) works in the same way.

Figure 4:
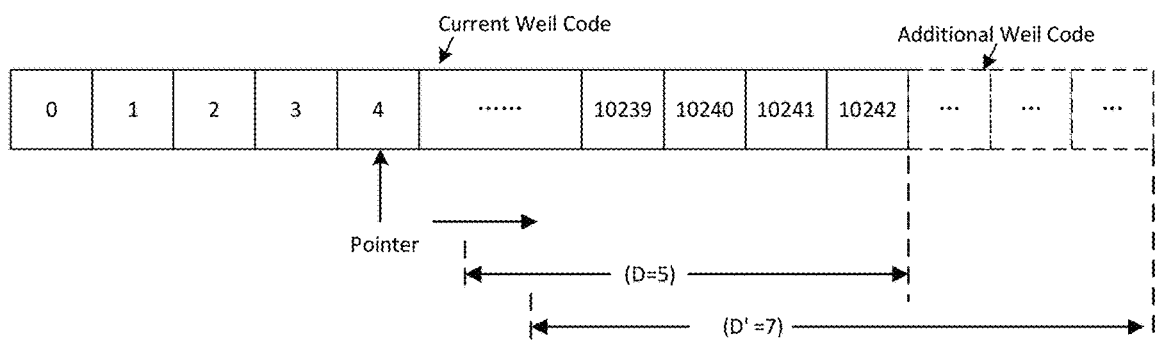
FIG. 4 is a diagram illustrating a current Weil code according to an embodiment.

FIG. 4 is a diagram illustrating a current Weil code stored in the channel (10) according to an embodiment. The current Weil code stored in the channel (10) is sequentially read bit by bit in a forward direction from a current position (as indicated by the pointer INT) to an end of the current Weil code. An effective Weil code depth (D) of the current Weil code is detected and monitored. The effective Weil code depth (D) of the current Weil code is defined as a number of remaining bits from the current position to the end of the current Weil code (e.g., D=5 as shown in FIG. 4).

The phase data storage (14) of the address-read control unit (11) of the channel (10) may store a pair of current phases (index1, index2) that are obtained from observant signals received from a satellite. The phase data storage (14) may also store a pair of initial phases (init_index1, init_index2) that have been initially setup.

A pair of sequence addresses (ADDR1, ADDR2) may be obtained from the pair of current phases (index1, index2) and the effective Weil code depth (D) of the current Weil code. For example, a first sequence address (ADDR1) can be obtained as a first current phase (index1) plus the effective Weil code depth (D) of the current Weil code, and a second sequence address (ADDR2) can be obtained as a second current phase (index2) plus the effective Weil code depth (D) of the current Weil code. That is, ADDR1=index1+D, and ADDR2=index2+D.

As illustrated in FIGS. 1-3, the pair of sequence addresses (ADDR1, ADDR2) are respectively transmitted to the two ROMs (30) in order to respectively visit the first and the second Legendre sequences (LS1, LS2). To avoid wrap-around operations, the pair of sequence addresses (ADDR1, ADDR2) are respectively transmitted to the first portion of the first Legendre sequence (LS1) and the first portion of the second Legendre sequence (LS2) to respectively start reading the first and the second Legendre sequences (LS1 and LS2) to avoid a wrap-around operation. Here, S=8, N=10243, for example.

In response to receiving the sequence addresses (ADDR1, ADDR2), the first and the second Legendre sequences (LS1, LS2) respectively output a first and a second S-bit data (Data1, Data2). Both first and a second S-bit data have the Legendre bit-read length S (e.g., S=8). The first and the second S-bit data (Data1, Data2) are transmitted to the win channel (10) via the read arbiter (20). The XOR storage (16) of the address-read control unit (12) in the win channel (10) may store the first and the second S-bit data (Data1, Data2).

Figure 5:
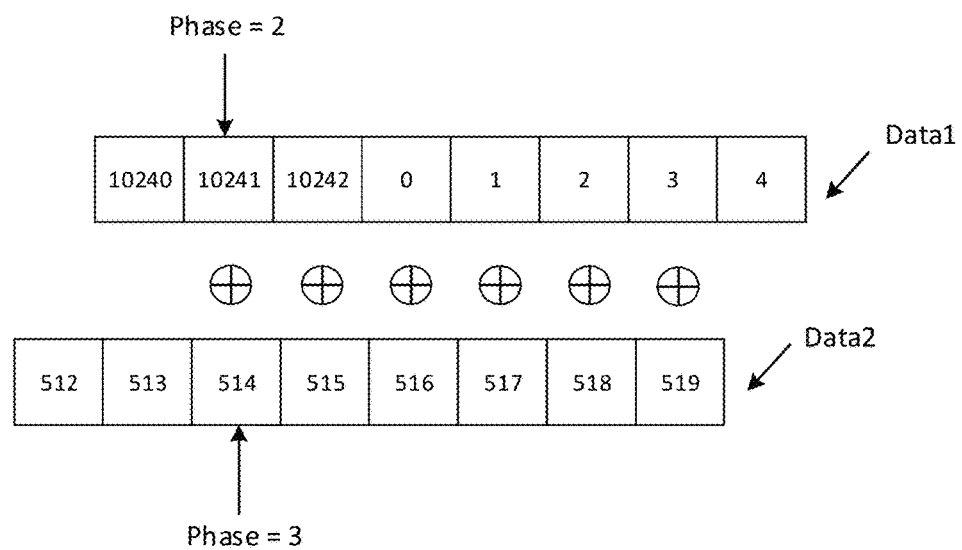
FIG. 5 is a diagram illustrating an XOR operation on two S-bit data according to an embodiment.

FIG. 5 is a diagram illustrating an XOR operation on two S-bit data (Data1, Data2) according to an embodiment. The XOR operation unit (15) of the address-read control unit (12) in the win channel (10) may perform an XOR operation on the first and the second S-bit data (Data1, Data2) to obtain an additional Weil code (as shown in dashes). As shown in FIG. 5, the XOR operation on the first and the second S-bit data (Data1, Data2) is performed bit by bit starting from phase 2 (phase=2) of the first S-bit data (Data1) and phase 3 (phase=3) of the second S-bit data (Data2), and a 6-bit additional Weil code is obtained. Then, the win channel (10) may add the additional Weil code to the end of the current Weil code to form an extended Weil code with a current effective Weil code depth (D').

The win channel (10) may continue to detect the current effective Weil code depth (D') of the extended Weil code to check whether another additional Weil code is needed. For example, responsive to detecting the current effective Weil code depth (D') of the extended Weil code is less than the Legendre bit-read length (S), another pair of sequence addresses (ADDR1' and ADDR2') will be respectively transmitted to the first and the second Legendre sequences (LS1, LS2) in the two ROMs in order to obtain another additional Weil code, which will be added to the end of the extended Weil code. These processes will be repeated until the current effective Weil code depth (D') of the extended Weil code is detected equal to or greater than the Legendre bit-read length (S).

Figure 6:
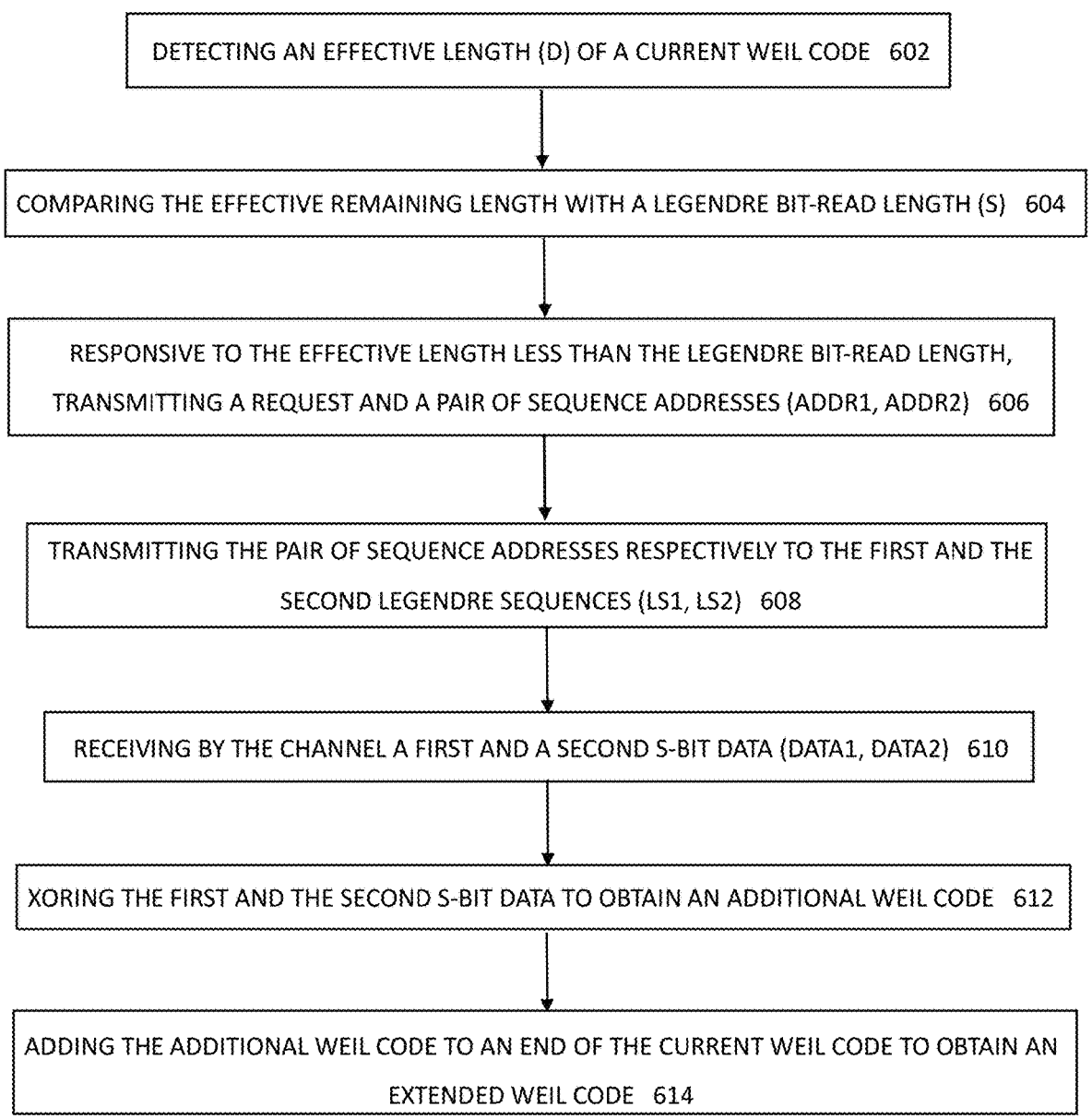
FIG. 6 is a flowchart illustrating a method of generating Wei codes using a Weil code generator according to an embodiment.

FIG. 6 is a flowchart illustrating a method (600) of generating Wei codes using a Weil code generator (100) according to an embodiment. As shown in FIG. 1, the Weil code generator (100) may include a plurality of parallel channels (10), a multi-channel read arbiter (20), and two parallel ROMs (30), which are connected in series. The method (600) of generating Wei codes using the Weil code generator (100) is described as follows.

In block 602, detecting an effective Weil code depth (D) of a current Weil code stored in a current channel (e.g., 10(1)) of the plurality of channels (10). As shown in FIG. 4, D=5.

In block 604, comparing the effective Weil code depth (D) with a Legendre bit-read length (S), which is previously defined. As shown in FIG. 3, S=8.

In block 608, responsive to the effective Weil code depth (D) being detected less than the Legendre bit-read length (S), transmitting by the channel (10) a request and a pair of sequence addresses (ADDR1, ADDR2) to the read arbiter (20). Both the first and the second Legendre sequences have a Legendre sequence length (2N) that is double the Weil code length (N). As shown in FIGS. 2-3, N=10243.

In block 610, transmitting the pair of sequence addresses (ADDR1, ADDR2) by the read arbiter (20) respectively to the first and the second Legendre sequences (LS1, LS2).

In block 612, receiving by the current channel (10), via the read arbiter (20), a first and a second S-bit data (Data1, Data2) respectively obtained from the first and the second Legendre sequences (LS1, LS2) based on the pair of sequence addresses (ADDR1, ADDR2).

In block 614, XORing the first and the second S-bit data (Data1, Data2) by the current channel (10) to obtain an additional Weil code.

In block 616, adding the additional Weil code to an end of the current Weil code to obtain an extended Weil code.

In an embodiment, the method (600) of generating Wei codes using the Weil code generator (100) may further include detecting the effective Weil code depth (D') of the extended Weil code to compare with the Legendre bit-read length (S).

Responsive to detecting the effective Weil code depth (D') of the extended Weil code less than the Legendre bit-read length (S), the channel (10) transmits another pair of sequence addresses (ADDR1', ADDR2') respectively to the first and the second Legendre sequences (LS1, LS2) via the read arbiter (20) to obtain another additional Weil code that is added to the end of the extended Weil code, so that the effective Weil code depth (D') of the extended Weil code reaches or exceeds the Legendre bit-read length (S).

In this way, due to the improved Weil code generator, there is no need to wrap around when reading the Legendre sequences that are respectively stored in the ROMs, and thus the Weil code generator can generate Weil codes efficiently.

Figure 7:
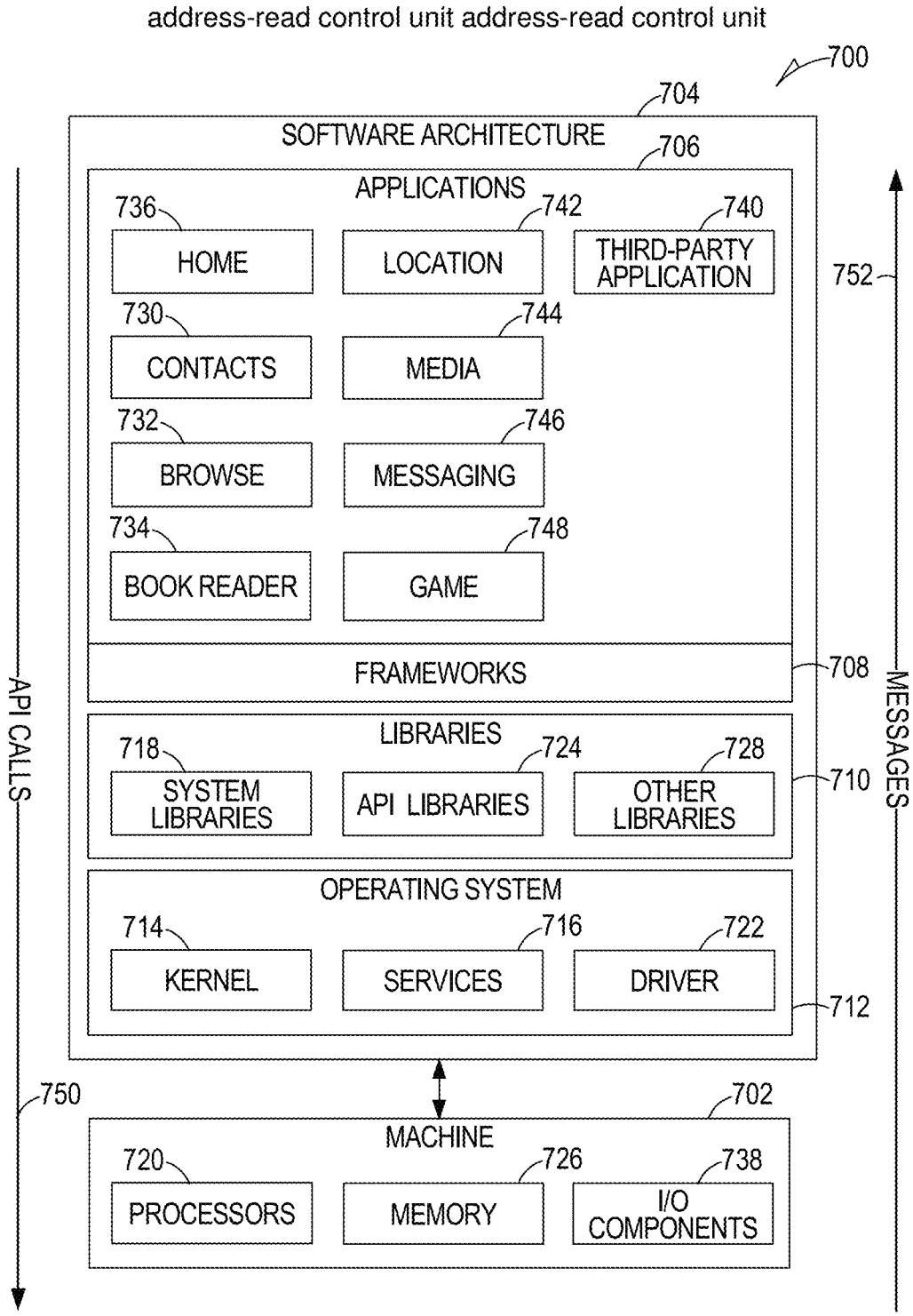
FIG. 7 is a block diagram showing a software architecture within which examples may be implemented.

FIG. 7 is a block diagram 700 illustrating a software architecture 704, which can be installed on any one or more of the wireless smart devices (such as a smart socket) described herein. The software architecture 704 is supported by hardware such as a machine 702 that includes processors 720, memory 726, and I/O components 738. In this example, the software architecture 704 can be conceptualized as a stack of layers, where each layer provides a particular functionality. The software architecture 704 includes layers such as an operating system 712, libraries 710, frameworks 708, and applications 706. Operationally, the applications 706 invoke API calls 750 through the software stack and receive messages 752 in response to the API calls 750.

The operating system 712 manages hardware resources and provides common services. The operating system 712 includes, for example, a kernel 714, services 716, and drivers 722. The kernel 714 acts as an abstraction layer between the hardware and the other software layers. For example, the kernel 714 provides memory management, processor management (e.g., scheduling), component management, networking, and security settings, among other functionality. The services 716 can provide other common services for the other software layers. The drivers 722 are responsible for controlling or interfacing with the underlying hardware. For instance, the drivers 722 can include display drivers, camera drivers, BLUETOOTH® or BLUETOOTH® Low Energy drivers, flash memory drivers, serial communication drivers (e.g., USB drivers), WI-FI® drivers, audio drivers, power management drivers, and so forth.

The libraries 710 provide a common low-level infrastructure used by the applications 706. The libraries 710 can include system libraries 718 (e.g., C standard library) that provide functions such as memory allocation functions, string manipulation functions, mathematic functions, and the like. In addition, the libraries 710 can include API libraries 724 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC), Adaptive Multi-Rate (AMR) audio codec, Joint Photographic Experts Group (JPEG or JPG), or Portable Network Graphics (PNG)), graphics libraries (e.g., an OpenGL framework used to render in two dimensions (2D) and three dimensions (3D) in a graphic content on a display), database libraries (e.g., SQLite to provide various relational database functions), web libraries (e.g., WebKit to provide web browsing functionality), and the like. The libraries 710 can also include a wide variety of other libraries 728 to provide many other APIs to the applications 706.

The frameworks 708 provide a common high-level infrastructure that is used by the applications 706. For example, the frameworks 708 provide various graphical user interface (GUI) functions, high-level resource management, and high-level location services. The frameworks 708 can provide a broad spectrum of other APIs that can be used by the applications 706, some of which may be specific to a particular operating system or platform.

In an example, the applications 706 may include a home application 736, a contacts application 730, a browser application 732, a book reader application 734, a location application 742, a media application 744, a messaging application 746, a game application 748, and a broad assortment of other applications such as a third-party application 740. The applications 706 are programs that execute functions defined in the programs. Various programming languages can be employed to create one or more of the applications 706, structured in a variety of manners, such as object-oriented programming languages (e.g., Objective-C, Java, or C++) or procedural programming languages (e.g., C or assembly language). In a specific example, the third-party application 740 (e.g., an application developed using the ANDROID™ or IOS™ software development kit (SDK) by an entity other than the vendor of the particular platform) may be mobile software running on a mobile operating system such as IOS™, ANDROID™, WINDOWS® Phone, or another mobile operating system. In this example, the third-party application 740 can invoke the API calls 750 provided by the operating system 712 to facilitate functionality described herein.

Features and aspects of various embodiments may be integrated into other embodiments, and embodiments illustrated in this document may be implemented without all of the features or aspects illustrated or described.

One skilled in the art will appreciate that although specific examples and embodiments of the system and methods have been described for purposes of illustration, various modifications can be made without deviating from the spirit and scope of the present application. Moreover, features of one embodiment may be incorporated into other embodiments, even where those features are not described together in a single embodiment within the present document. Accordingly, the application is described by the appended claims.

We claim:

1. A Weil code generator (100) to generate Weil codes (WCD) with a Weil code length (N) comprising:
a plurality of channels (10) in parallel, a channel of the plurality of channels storing a current Weil code to demodulate signals from a satellite, and comprising an address-read control unit (11) and a processing and registration unit (12);
a multi-channel read arbiter (20) connected in parallel to the plurality of channels to determine a win channel from the plurality of channels; and
two Legendre read-only memories (ROMs) (30) connected in parallel to the read arbiter and respectively storing a first and a second Legendre sequences (LS1 and LS2) each having a Legendre sequence length (2N) being double the Weil code length (N);
wherein the current Weil code is sequentially read bit by bit in a direction from a current position toward an end of the current Weil code, and wherein an effective Weil code depth (D) of the current Weil code is a number of remaining bits from the current position to the end of the current Weil code;
wherein the address-read control unit (11) comprises an updating unit (13), and a phase data storage (14), and wherein the phase data storage (14) stores a pair of current phases (index1, index2) obtained from observant signals from the satellite, and a pair of initial phases (init_index1, init_index2) initially setup;
wherein a pair of sequence addresses (ADDR1, ADDR2) are obtained from the pair of current phases (index1, index2) and the effective Weil code depth (D) of the current Weil code.

2. The Weil code generator of claim 1,
wherein the first Legendre sequence (LS1) has a first portion and a second portion, in sequence, the first portion and the second portion of the first Legendre sequence being the same in data structure and each having a half-length (N) of the Legendre sequence length (2N), and wherein the second Legendre sequence (LS2) has a first portion and a second portion in sequence, the first portion and the second portion of the second Legendre sequence being the same in data structure and each having the half-length (N) of the Legendre sequence length (2N).

3. The code generator of claim 1, wherein a first sequence address (ADDR1) of the pair of sequence addresses is obtained as a first current phase (index1) plus the effective Weil code depth (D) of the current Weil code, and wherein a second sequence address (ADDR2) of the pair of sequence addresses is obtained as a second current phase (index2) plus the effective Weil code depth (D) of the current Weil code.

4. The code generator of claim 1, wherein the processing and registration unit (12) comprises an XOR operation unit (15), an XOR storage (16), and a register (17) to store the current Weil code.

5. The code generator of claim 1, wherein the read arbiter (20) is configured to determine the win channel from the plurality of channels (10) using a polling arbitration in a sequential order to ensure that the plurality of channels have equal arbitration chances to get access to the two ROMs.

6. A Weil code generator (100) to generate Weil codes (WCD) with a Weil code length (N) comprising:
a plurality of channels (10) in parallel, a channel of the plurality of channels storing a current Weil code to demodulate signals from a satellite, and comprising an address-read control unit (11) and a processing and registration unit (12);
a multi-channel read arbiter (20) connected in parallel to the plurality of channels to determine a win channel from the plurality of channels; and
two Legendre read-only memories (ROMs) (30) connected in parallel to the read arbiter and respectively storing a first and a second Legendre sequences (LS1 and LS2) each having a Legendre sequence length (2N) being double the Weil code length (N);
wherein the current Weil code is sequentially read bit by bit in a direction from a current position toward an end of the current Weil code, and wherein an effective Weil code depth (D) of the current Weil code is a number of remaining bits from the current position to the end of the current Weil code;
wherein in response to detecting the effective Weil code depth (D) less than a Legendre bit-read length (S), the channel sends a request and a pair of sequence addresses (ADDR1, ADDR2) to the read arbiter (20), the Legendre bit-read length (S) being a number of bits the channel reading from the first or the second Legendre sequence in a single read operation, and the Legendre bit-read length (S) being 8, 16, 32, or 64.

7. The code generator of claim 6, wherein the pair of sequence addresses (ADDR1, ADDR2) are respectively transmitted to the first and the second Legendre sequences (LS1, LS2).

8. The code generator of claim 7, wherein the pair of sequence addresses (ADDR1, ADDR2) respectively start visiting the first portions of the first and the second Legendre sequences (LS1, LS2).

9. The code generator of claim 8, wherein the first and the second Legendre sequences (LS1, LS2) respectively output a first and a second S-bit data (Data1, Data2) each having the Legendre bit-read length (S), and wherein the first and the second S-bit data are transmitted to the win channel (10) via the read arbiter (20).

10. The code generator of claim 9, wherein the win channel (10) performs an XOR operation on the first and the second S-bit data (Data1, Data2) to obtain an additional Weil code.

11. The code generator of claim 10, wherein the win channel (10) adds the additional Weil code to the end of the current Weil code to form an extended Weil code.

12. The code generator of claim 11, wherein a current effective Weil code depth (D') of the extended Weil code is detected.

13. The code generator of claim 12, wherein responsive to detecting the current effective Weil code depth (D') of the extended Weil code is detected less than the Legendre bit-read length (S), another pair of sequence addresses (ADDR1', ADDR2') are respectively transmitted to the first and the second Legendre sequences (LS1, LS2) in order to obtain another additional Weil code to add to an end of the extended Weil code until the current effective Weil code depth (D') of the extended Weil code reaches the Legendre bit-read length (S).

14. A method of generating Wei codes (WCD) with a Weil code length (N) using a Weil code generator (100), the Weil code generator comprising a plurality of parallel channels (10), a multi-channel read arbiter (20), and two parallel Legendre read-only memories (ROMs) (30), connected in series, the method comprising:
- detecting an effective Weil code depth (D) of a current Weil code (CURR WCD) stored in a channel (10) of the plurality of channels, the channel communicating with a satellite;
- comparing the effective Weil code depth (D) with a Legendre bit-read length (S) of a first and a second Legendre sequences (LS1, LS2) respectively stored in the two Legendre ROMs (30);
- responsive to the effective Weil code depth (D) being detected less than the Legendre bit-read length (S), transmitting by the channel (10) a request and a pair of sequence addresses (ADDR1, ADDR2) to the read arbiter (20), each of the first and the second Legendre sequences having a Legendre sequence length (2N) being double the Weil code length (N);
- transmitting the pair of sequence addresses (ADDR1, ADDR2) by the read arbiter (20) respectively to the first and the second Legendre sequences (LS1, LS2);
- receiving by the channel (10), via the read arbiter (20), a first and a second S-bit data (Data1, Data2) obtained respectively from the first and the second Legendre sequences (LS1, LS2) as a function of the pair of sequence addresses (ADDR1, ADDR2);
- XORing the first and the second S-bit data (Data1, Data2) by the channel (10) to obtain an additional Weil code (ADD WCD); and
- adding the additional Weil code to an end of the current Weil code to obtain an extended Weil code (EXD WCD).

15. The method of claim 14, further comprising determining by the read arbiter (20) a win channel from the plurality of channels (10) using a polling arbitration in a sequential order so that the plurality of channels have equal arbitration chances to get access to the Legendre ROMs.

16. The method of claim 14, further comprising detecting the effective Weil code depth (D') of the extended Weil code (EXT WCD) to compare with the Legendre bit-read length (S) of the first and the second Legendre sequences (LS1, LS2).

17. The method of claim 16, further comprising responsive to detecting the effective Weil code depth (D') of the extended Weil code less than the Legendre bit-read length (S), transmitting by the channel (10) another pair of sequence addresses (ADDR1', ADDR2') respectively to the first and the second Legendre sequences via the read arbiter (20) to obtain another additional Weil code to add to an end of the extended Weil code until the effective Weil code depth (D') of the extended Weil code reaches or exceeds the Legendre bit-read length (S).

* * * * *